United States Patent [19]

Higuchi

[11] Patent Number: 5,246,811
[45] Date of Patent: Sep. 21, 1993

[54] IMAGE FORMING METHOD OF PRESSING LIGHT-SENSITIVE MATERIAL ON IMAGE RECEIVING MATERIAL

[75] Inventor: Manabu Higuchi, Kanagawa, Japan

[73] Assignee: Fuji Photo Film Co., Ltd., Kanagawa, Japan

[21] Appl. No.: 822,217

[22] Filed: Jan. 17, 1992

[30] Foreign Application Priority Data

Jan. 17, 1991 [JP] Japan .................................. 3-15655

[51] Int. Cl.$^5$ .................................................. G03C 1/72
[52] U.S. Cl. ................................... 430/138; 430/203; 430/253; 430/254; 430/350; 430/353
[58] Field of Search ............... 430/138, 203, 253, 254, 430/353, 350, 617, 281

[56] References Cited

U.S. PATENT DOCUMENTS

| | | | |
|---|---|---|---|
| 4,822,717 | 4/1989 | Nakamura | 430/138 |
| 4,933,256 | 6/1990 | Kakimi | 430/138 |
| 5,073,472 | 12/1991 | Yamamoto | 430/138 |

FOREIGN PATENT DOCUMENTS 3-69959 3/1991 Japan.

*Primary Examiner*—Marion E. McCamish
*Assistant Examiner*—Janis L. Dote
*Attorney, Agent, or Firm*—Sughrue, Mion, Zinn, Macpeak & Seas

[57] ABSTRACT

An image forming method uses a light-sensitive material and an image receiving material. The light-sensitive material comprises a support and a light-sensitive layer provided thereon. The light-sensitive layer contains silver halide, a reducing agent, pigment particles, an ethylenically unsaturated polymerizable compound and a base precursor. The silver halide, the reducing agent, the pigment particles, the polymerizable compound and the base precursor are contained in microcapsules dispersed in the light-sensitive layer. The image forming method comprises imagewise exposing the light-sensitive material, developing the light-sensitive material to polymerize the polymerizable compound, and pressing the light-sensitive material on the image receiving material to transfer the pigment particles to the image receiving material. In the present invention, the light-sensitive material is pressed at a pressure in the range of 20 kg/cm$^2$ to 500 kg/cm$^2$ while heating the light-sensitive material at 30° C. to 130° C. The light-sensitive material and the image receiving material are usually pressed by rollers. At least one of the rollers facing the light-sensitive material preferably is a heated roller, and the light-sensitive material is heated by the heated roller. The diameters of the rollers are preferably in the range of 5 mm to 40 mm. The support of the light-sensitive material is preferably made of a polymer film. The thickness of the polymer film support is preferably in the range of 5μm to 50 μm.

15 Claims, 1 Drawing Sheet

IMAGE FORMING METHOD OF PRESSING LIGHT-SENSITIVE MATERIAL ON IMAGE RECEIVING MATERIAL

FIELD OF THE INVENTION

The present invention relates to an image forming method of exposing and heating a light-sensitive material and pressing the material on an image receiving material.

BACKGROUND OF THE INVENTION

U.S. Pat. No. 4,912,011 discloses a light-sensitive material comprising a support and a light-sensitive layer provided thereon which contains silver halide, a reducing agent, a polymerizable compound and a color image forming substance. The silver halide, the reducing agent, the polymerizable compound and the color image forming substance are contained in microcapsules (light-sensitive microcapsules) which are dispersed in the light-sensitive layer. The U.S. Patent corresponds to Japanese Patent Provisional Publications No. 61(1986)-275742 and No. 61(1986)-278849 and European Patent Provisional Publication No. 0203613A.

An image forming method using the light-sensitive material is also disclosed in U.S. Pat. No. 4,912,011. The method comprises the steps of imagewise exposing the light-sensitive material, and heating the light-sensitive material. A latent image of the silver halide is formed by the exposure. The polymerizable compound is polymerized by heating within the area where the latent image has been formed. The light-sensitive material is then pressed on an image-receiving material to transfer the unpolymerized polymerizable compound with a color image forming substance to the image-receiving material to form a color image on the image-receiving material.

Further, a method of polymerizing the polymerizable compound within the area where the latent image of the silver halide has not been formed is disclosed in Japanese Patent Provisional Publications No. 61(1986)-243449, No. 61(1986)-260241, No. 2(1990)-141756 and No. 2(1990)-141757. The contents of the former two publications are described in European Patent Provisional Publication No. 0202490A.

The development and polymerization reactions smoothly proceed in alkaline conditions. Therefore, the light-sensitive material preferably contains a base precursor as an image forming accelerator. The base precursor is more preferably incorporated into light-sensitive microcapsules, as is described in U.S. Pat. No. 4,939,064 (corresponding to Japanese Patent Provisional Publication No. 64(1989)-32251 and European Patent Provisional Publication No. 0301539A) and Japanese patent Provisional Publications No. 1(1089)-263641, No. 2(1990)-146041 and No. 2(1991)-25444. The base precursor is composed of a salt of an organic base with a carboxylic acid, and is generally used in the form of solid particles.

With respect to a color image forming substance, the pigment particles have recently been used to obtain a stable color image. Accordingly, in the recent embodiment of the light-sensitive material, silver halide, a reducing agent, pigment particles, a polymerizable compound and a base precursor are contained in microcapsules which are dispersed in the light-sensitive layer.

SUMMARY OF THE INVENTION

The applicant has studied an image forming method using the above-mentioned recent embodiment of the light-sensitive material. According to study of the applicant, the viscosity of the contents of the microcapsule including pigment particles and a base precursor is so high that the pigment particles are not well transferred from the light-sensitive material to an image receiving material. Accordingly, a very high pressure (more than 500 kg/cm$^2$, preferably more than 1,000 kg/cm$^2$) is necessary to obtain a clear transferred image. The high pressure requires a large and heavy pressing device, which is not appropriate for constructing a compact image recording apparatus.

An object of the invention is to provide an image forming method which forms a clear image on an image receiving material, even if the pressure for transferring the image is not more than 500 kg/cm$^2$.

There is provided by the present invention an image forming method which comprises the steps of:

imagewise exposing a light-sensitive material which comprises a support and a light-sensitive layer provided thereon containing silver halide, a reducing agent, pigment particles, an ethylenically unsaturated polymerizable compound and a base precursor, said silver halide, said reducing agent, said pigment particles, said polymerizable compound and said base precursor being contained in microcapsules which are dispersed in the light-sensitive layer;

simultaneously or thereafter developing the light-sensitive material to polymerize the polymerizable compound; and pressing the light-sensitive material on an image receiving material to transfer the pigment particles to the image receiving material at a pressure in the range of 20 kg/cm$^2$ to 500 kg/cm$^2$ while heating the light-sensitive material at 30° C. to 130° C.

The process of pressing the light-sensitive material on an image receiving material while heating the light-sensitive material is disclosed in U.S. Pat. Nos. 4,822,717 and No. 4,933,256. The applicant has found that the viscosity of the contents of the microcapsule can be lowered by heating the light-sensitive material. Accordingly, the method of the present invention forms a clear image on an image receiving material even though the pressure for transferring the image is relatively low (in the range of 20 kg/cm$^2$ to 500 kg/cm$^2$).

The image forming method of the invention is preferably conducted under the following conditions:

(1) the light-sensitive material and the image receiving material are pressed by rollers;

(2) at least one of the rollers facing the light-sensitive material is a heated roller, and the light-sensitive material is heated by the heated roller;

(3) the diameters of the rollers are in the range of 5 mm to 40 mm; and (4) the support of the light-sensitive material is made of a polymer film having a thickness in the range of 5 μm to 50 μm.

The light-sensitive material and the image receiving material are usually pressed by rollers. At least one of the rollers facing the support of the light-sensitive material preferably is a heated roller, and the light-sensitive material is preferably heated by the heated roller. The sizes of the rollers are preferably small to construct a compact image recording apparatus.

According to study of the applicant, however, it is difficult to heat and press the light-sensitive material by a small heated roller (the diameter in the range of 5 mm to 40 mm). When the diameter of the heated roller is small, the contact area of the roller with the light-sensitive material is small. Accordingly, the light-sensitive material is not sufficiently heated or pressed by the small heated roller.

To solve the above-mentioned problems caused by the small heated roller, the applicant proposes to use a very thin (thickness: 5 $\mu$m to 50 $\mu$m) polymer film as a support of the light-sensitive material. The applicant surprisingly finds that the light-sensitive material using a very thin polymer film support can be well heated and pressed by the small heated roller. Accordingly, a clear transferred image can be obtained by using the specific support even though a small heated roller is used.

DETAILED DESCRIPTION OF THE INVENTION

Figure 1:
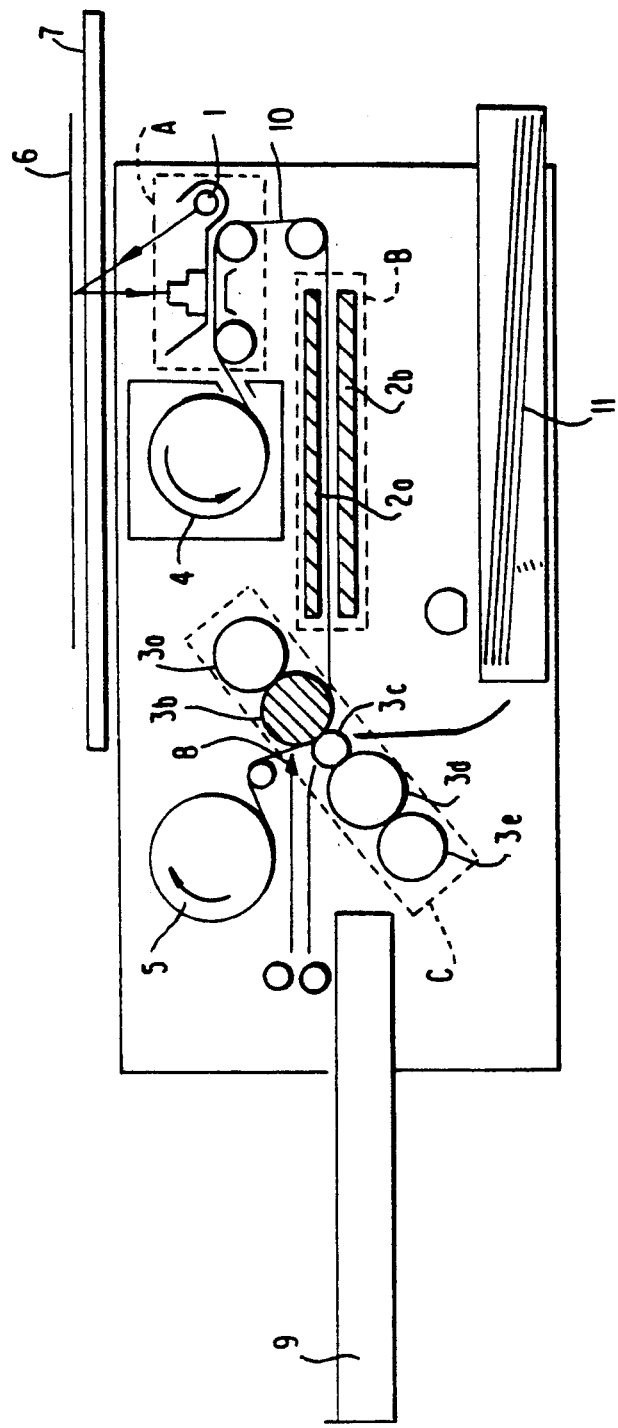
FIG. 1 is a sectional view schematically illustrating an image recording apparatus.

The image forming method of the present invention is characterized in the specific process of pressing the light-sensitive material on an image receiving material to transfer the pigment particles to the image receiving material.

In the present invention, the light-sensitive material is pressed on the image receiving material at a pressure in the range of 20 kg/cm$^2$ to 500 kg/cm$^2$. The pressure is more preferably in the range of 50 kg/cm$^2$ to 300 kg/cm$^2$.

A low pressure is preferred to construct a compact image recording apparatus. However, the density of the transferred image is insufficient, when the pressure is less than 20 kg/cm$^2$. Further, the mechanical strength of the microcapsules should be lowered when the pressure is low. Mechanically weak microcapsules are easily ruptured, and it is difficult to handle a light-sensitive material containing the weak microcapsules.

On the other hand, a pressure of not more than 500 kg/cm$^2$ is sufficient to obtain a clear transferred image. When the pressure is more than 500 kg/cm$^2$, a huge transferring device is necessary, and it is difficult to construct a compact image recording apparatus.

In the invention, the light-sensitive material is pressed on the image receiving material while heating the light-sensitive material is heated at 30° C. to 130° C. The light-sensitive material is preferably heated at 50° C. to 90° C. The viscosity of the contents of the microcapsule is lowered by heating the light-sensitive material.

When the temperature is low, the contents of the microcapsule are not well transferred to the image receiving material. Accordingly, the density (reflection density or transparent density) of the transferred image is insufficient when the heating temperature is lower than 30° C.

On the other hand, the reflection density of the transferred image is also insufficient when the heating temperature is higher than 130° C. though the contents of the microcapsule are well transferred to the image receiving material. The reason of the problem caused by the high temperature is not clear. However, it can be presumed that the transferred pigment particles may permeate into the image receiving material when the temperature is high so that the reflection density might be low.

The light-sensitive material and the image receiving material are preferably pressed by rollers. Various heating means can be used to heat the light-sensitive material, however the most convenient way is to use a heated roller. Accordingly, at least one of the rollers facing the support of the light-sensitive material preferably is a heated roller, and the light-sensitive material is preferably heated by the heated roller. It is usually sufficient that only one roller facing the support of the light-sensitive material is a heated roller.

In the present invention, the diameters of the rollers are preferably in the range of 5 mm to 40 mm, and more preferably in the range of 10 mm to 30 mm.

When the diameters of the rollers are less than 5 mm, it is difficult to press uniformly the light-sensitive material and the image receiving material. Further, the contact area of the roller with the light-sensitive material is very small, when the small rollers are used. Accordingly, a long time is required to heat the light-sensitive material when the very small heated roller is used.

On the other hand, the diameters of the rollers are preferably not more than 40 mm to construct a compact image recording apparatus.

In the invention, the speed of conveying the light-sensitive material and the image receiving material between the rollers is preferably in the range of 0.3 m/min to 30 m/min, and more preferably in the range of 1 m/min to 5 m/min.

When the speed is higher than 30 m/min, the density of the transferred image is lowered by the short transferring time.

On the other hand, the speed is preferably not lower than 0.3 m/min to form quickly a transferred image.

Further, the support of the light-sensitive material is preferably made of a polymer film. The thickness of the polymer film support is preferably in the range of 5 $\mu$m to 50 $\mu$m, and more preferably in the range of 6 $\mu$m to 30 $\mu$m.

A thin support is preferred to heat the light-sensitive material. However, when the thickness is lower than 5 $\mu$m, the mechanical strength of the support is insufficient.

On the other hand, it is difficult to heat the light-sensitive material when the thickness of the support is more than 50 $\mu$m. Further, the light-sensitive material is usually prepared in the form of a rolled film. When a thick support is used, the diameter of the rolled light-sensitive material is increased. This is inappropriate for constructing a compact image recording apparatus.

As is described above, the most preferred embodiment of the present invention is an image forming method which comprises the steps of:

imagewise exposing a light-sensitive material which comprises a polymer film support having a thickness in the range of 5 $\mu$m to 50 $\mu$m and a light-sensitive layer provided thereon containing silver halide, a reducing agent, pigment particles, an ethylenically unsaturated polymerizable compound and a base precursor, said silver halide, said reducing agent, said pigment particles, said polymerizable compound and said base precursor being contained in microcapsules which are dispersed in the light-sensitive layer;

simultaneously or thereafter developing the light-sensitive material to polymerize the polymerizable compound; and pressing the light-sensitive material on an image receiving material to transfer the pigment particles to the image receiving material at a pressure in the range of 20 kg/cm² to 500 kg/cm² while heating the light-sensitive material at 30° C. to 130° C., wherein the light-sensitive material and the image receiving material are pressed by rollers, at least one of the rollers facing the light-sensitive material is a heated roller, the light-sensitive material is heated by the heated roller and the diameters of the rollers are in the range of 5 mm to 40 mm.

An image recording apparatus used in the present invention is described below.

FIG. 1 is a sectional view schematically illustrating an image recording apparatus.

The light-sensitive material (10) is in the form of a continuous film and is rolled around a roller (4). At an exposure device (A), the light-sensitive material (10) is imagewise exposed to light. The light is emitted from the light source (1) and is reflected from an original (6) placed on a glass plate (7).

The exposed light-sensitive material (10) is developed at a heat development device (B). The light-sensitive material is heated between heaters (2a) and (2b).

The heated light-sensitive material (10) is then pressed on an image receiving material (11) at a transferring device (C). The materials are pressed between rollers (3b) and (3c). The rollers (3a) and (3c), are back-up rollers which have a function of adjusting the pressure. The roller (3b) is a heated roller, and the light-sensitive material is heated from the side of the support by the roller (3b). In the FIG. 1, the diameter of the roller (3b) is 32 mm, and the diameter of the roller (3c) is 8 mm.

The image receiving material is then separated from the light-sensitive material by a separating mean (9), and placed on a tray (9). The used light-sensitive material is rolled around a roller (5).

The components of the light-sensitive material such as silver halide, a reducing agent, pigment particles, a polymerizable compound, a base precursor, microcapsules and a support are described below in detail.

There is no specific limitation on the preparation of microcapsules, and any known processes can be employed. Examples of the processes for preparing microcapsules include a process using coacervation of hydrophilic wall forming materials (U.S. Pat. No. 2,800,457 and U.S. Pat. No. 2,800,458); an interfacial polymerization process (U.S. Pat. No. 3,287,154, U.K. Patent No. 990,443, and Japanese Patent Publications No. 38(1963)-19574, No. 42(1967)-446 and No. 42(1967)-771); a process using precipitation of polymers (U.S. Pat. No. 3,418,250 and U.S. Pat. No. 3,660,304); a process of using isocyanate-polyol wall-materials (U.S. Pat. No. 3,796,669); a process of using isocyanate wall-materials (U.S. Pat. No. 3,914,511); and a process of using amino-aldehyde resins (U.S. Pat. No. 4,001,140, U.S. Pat. No. 4,087,376, U.S. Pat. No. 4,089,802 and U.S. Pat. No. 4,025,455, and Japanese Patent Provisional Publications No. 62(1987)-209439, No. 64(1989)-91131 and No. 1(1989)-154140, and Japanese Patent Application No. 63(1988)-241635).

Examples of the amino-aldehyde resins include a urea-formaldehyde resin, a urea-formaldehyde-resorcinol resin, a melamine-formaldehyde resin, an acetoguanamine-formaldehyde resin and a benzoguanamine-formaldehyde resin.

Further, examples of the processes for preparing microcapsules include an in situ process using polymerization of monomers (Japanese Patent Publication No. 36(1961)-9168 and Japanese Patent Provisional Publication No. 51(1976)-9079); a polymerization dispersing and cooling process (U.K. Patents No. 927,807 and No. 965,074); and a spray-drying process (U.S. Pat. No. 3,111,407 and U.K. Patent No. 930,422).

A process for encapsulating oily droplets of the polymerizable compound is not limited to the above-mentioned ones, but a process of emulsifying core materials and then forming a polymeric membrane as a microcapsule shell over the core material is particularly preferred. A light-sensitive material using microcapsules having a shell of a polyamide resin and/or a polyester resin is described in Japanese Patent Provisional Publication No. 62(1987)-209437. A light-sensitive material using microcapsules having a shell of a polyurea resin and/or a polyurethane resin is described in Japanese Patent Provisional Publication No. 62(1987)-209438. A light-sensitive material using microcapsules having a gelatin shell is described in Japanese Patent Provisional Publication No. 62(1987)-209440.

A light-sensitive material using microcapsules having an epoxy resin shell is described in Japanese Patent Provisional Publication No. 62(1987)-209441. A light-sensitive material using microcapsules having a shell of a complex resin containing a polyamide resin and a polyurea resin is described in Japanese Patent Provisional Publication No. 62(1987)-209447. A light-sensitive material using microcapsules having a shell of a complex resin containing a polyurethane resin and a polyester resin is described in Japanese Patent Provisional Publication No. 62(1987)-209442.

A melamine-formaldehyde resin, of which fine microcapsules can be made is particularly preferred in the invention.

Japanese Patent Application No. 1(1989)-37782 discloses a microcapsule provided with a polymer shell of a polymeric compound (e.g., melamine-formaldehyde resin) around a film composed of a reaction product of a water-soluble polymer having a sulfinyl group and a polymerizable compound having an ethylenic unsaturated group. This fine microcapsule can be preferably employed in the invention.

In the case where aminoaldehyde resins are used for microcapsules, the amount of residual aldehyde is preferably regulated to be below a certain value (see: Japanese Patent Provisional Publication No. 63(1988)-32535).

A mean grain size of microcapsules is preferably within the range of 3 to 20 μm. It is preferred that the grain sizes of microcapsules be homogeneously dispersed in the range above a certain value (see: Japanese Patent Provisional Publication No. 63(1988)-5334). The ratio between the thickness and the grain size of a microcapsule is preferably within a certain range (see: Japanese Patent Provisional Publication No. 63(1988)-81336).

In the case where a silver halide is contained in microcapsules, the above-described mean grain size of the silver halide is preferably not more than one fifth of the mean grain size of microcapsules, and more preferably it is not more than one tenth. A homogeneous and smooth image can be obtained by regulating the mean grain size of the silver halide not to be more than one fifth of the mean grain size of microcapsules.

In the case where a silver halide is contained in microcapsules, the silver halide is preferably contained within the shell of the microcapsule. The light-sensitive material containing such a silver halide is described in Japanese Patent Provisional Publication No. 62(1987)-169147.

Examples of the silver halide employable for the light-sensitive material of the invention include silver chloride, silver bromide, silver iodide, silver chlorobromide, silver chloroiodide, silver iodobromide and silver chloroiodobromide in the form of grains.

The silver halide grains may be of various crystal forms, for example, a regular crystal form such as hexahedron, octahedron, dodecahedron or tetradecahedron, an irregular form such as spherical form or tubular form, a form having crystalline defect such as a twinning plane, and a mixed form thereof.

The silver halide grains may be extremely small sized grains having a grain diameter of not more than 0.01 μm, or may be relatively large sized grains having a grain diameter of projected area up to 10 μm. The silver halide emulsion may be a polydispersed emulsion or a monodispersed emulsion described in U.S. Pat. Nos. 3,574,628 and U.S. Pat. No. 3,655,394, and U.K. Patent No. 1,413,748.

A tubular grain having an aspect ratio of not less than about 5 can also be employed. The tubular silver halide grains can be easily prepared by processes described in Gutoff, "Photographic Science and Engineering, Vol. 14, pp. 248-257 (1970)," U.S. Pat. No. 4,434,226, U.S. Pat. No. 4,414,310, U.S. Pat. No. 4,433,048 and U.S. Pat. No. 4,439,520, and U.K. Patent No. 2,112,157.

As for the crystal structure of the silver halide grains, the individual grains may have a homogeneous halogen composition or a heterogeneous halogen composition in which the composition varies from the outer surface portion to the inside portion, or may be a multi-layer structure. Otherwise, the silver halide grains may be bonded with other silver halide grains having different halogen composition through epitaxial bonding, or may be bonded with compounds other than the silver halide such as silver rhodanate and lead oxide. Two or more kinds of silver halide grains which differ in halogen composition, crystal habit, grain size, and/or other features from each other can be employed in combination.

The silver halide photographic emulsions employable in the light-sensitive material of the invention can be prepared by processes described, for example, in "Research Disclosure (RD), No. 17,643, pp. 22-23 (Dec. 1978), (Emulsion preparation and types) and No. 18,716, p. 648.

The silver halide emulsion is generally used after subjecting it to physical ripening, chemical ripening and spectral sensitization. Various additives employable in those stages are described in Research Disclosure, No. 17,643 and No. 18,716. The relevant parts in the literature are described below in the form of a table.

Conventional photographic additives employable in the invention are also described in the Research Disclosure, and the relevant parts in the literature are also shown in the following table.

| Additives | RD 17,643 | RD 18,716 |
|---|---|---|
| Chemical sensitizing agent | p. 23 | p. 648 (right side) |
| Sensitivity-increasing agent | | p. 648 (right side) |
| Spectral sensitizing agent and Supersensitizing agent | p. 23-24 | p. 648 (right side)-p. 649 (right side) |
| Anti-fogging agent and Stabilizer | p. 24-25 | p. 649 (right side) |

It is preferred to use silver halide grains having a relatively low fogging value. A light-sensitive material using such silver halide is disclosed in Japanese Patent Provisional Publication No. 63(1988)-68830.

For uniformly incorporating the silver halide into microcapsules, a copolymer composed of a hydrophilic repeating unit and a hydrophobic repeating unit is preferably dissolved in the polymerizable compound. Details of the copolymer are described in Japanese Patent Provisional Publications No. 62(1987)-209450, No. 63(1988)-287844 and Japanese Patent Application No. 1(1989)-37782.

The reducing agent used in the present invention has a function of reducing silver halide and or a function of accelerating or inhibiting polymerization of the polymerizable compound.

Examples of the reducing agents employable for the invention include various compounds, such as hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductones, o- or p-sulfonamidophenols, o- or p-sulfonamidonaphthols, 2,4-disulfonamidephenols, 2,4-disulfonamidenaphthols, o- or p-acylaminophenols, 2-sulfonamidoindanones, 4-sulfonamido-5-pyrazolones, 3-sulfonamidoindoles, sulfonamidopyrazolobenzimidazoles, α-sulfonamidoketones and hydrazines.

The above-mentioned reducing agents are described in Japanese Patent Provisional Publications No. 61(1986)-183640, No. 61(1986)-188535, No. 61(1986)-228441, No. 62(1987)-70836, No. 61(1987)-86354, No. 62(1987)-86355, No. 62(1987)-206540, No. 62(1987)-264041, No. 62(1987)-109437 and No. 63(1988)-254442, No. 1(1989)-267536, No. 2(1990)-141756, No. 2(1990)-141757, No. 2(1990)-207254, No. 2(1990)-2626662, No. 2(1990)-267559 and No. 2(1990)-269352.

These reducing agents are also described in T. James, "The Theory of the Photographic Process", 4th edition, pp. 291-334 (1977), Research Disclosure Vol. 170, No. 17029, pp. 9-15 (June 1978), and Research Disclosure Vol. 176, No. 17643, pp. 22-31 (Dec. 1978). Further, there can be also employed a reducing agent precursor capable of releasing a reducing agent under heating or in contact with a base, as described in Japanese Patent Provisional Publication No. 62(1987)-210446. Also in the light-sensitive material of the invention, various reducing agents and reducing agent precursors described in the above publications, applications and literature can be effectively employed.

Among the above-mentioned reducing agents, those having a basic nature, which form a salt with an acid, can be used in the form of a salt with an appropriate acid.

In the case where two or more reducing agents are used in combination, certain interactions between the reducing agents may be expected. One of the interactions is for acceleration of reduction of silver halide (and/or an organic silver salt) through so-called superadditivity. Other interaction is for a chain reaction in which an oxidized state of one reducing agent formed by a reduction of silver halide (and/or an organic silver salt) induces the polymerization of the polymerizable compound by oxidation-reduction reaction with other reducing agent. Both interactions may occur simultaneously. Thus, it is difficult to determine which of the interactions has occurred in practical use.

Concrete examples of the above-mentioned reducing agents are as follows.

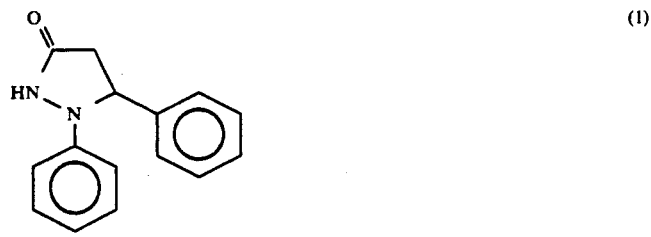

(1)

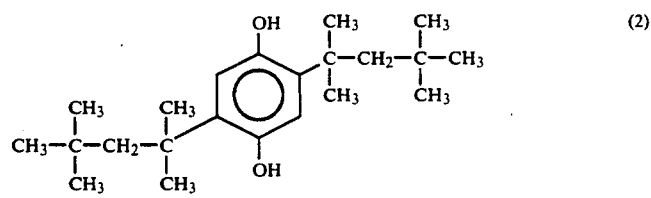

(2)

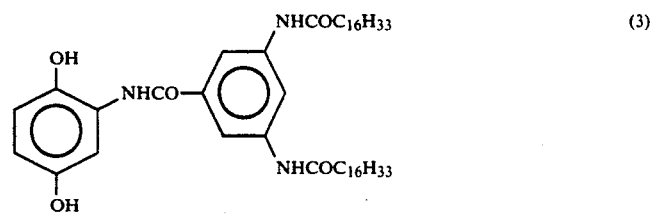

(3)

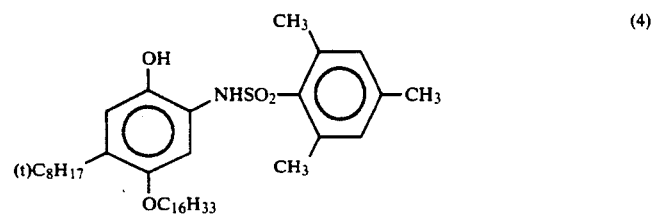

(4)

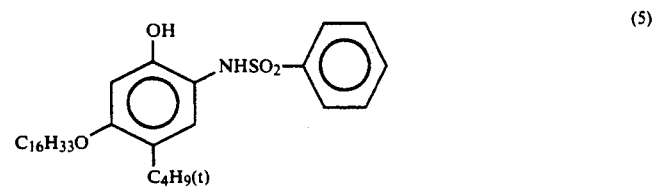

(5)

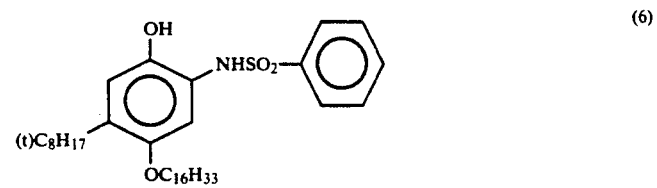

(6)

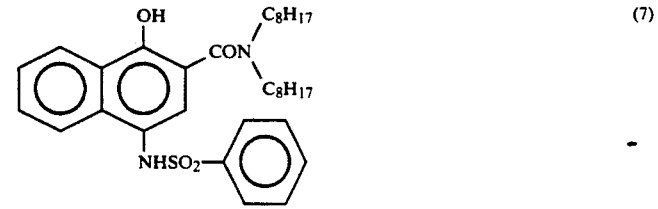

(7)

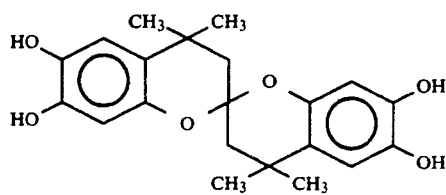
(8)

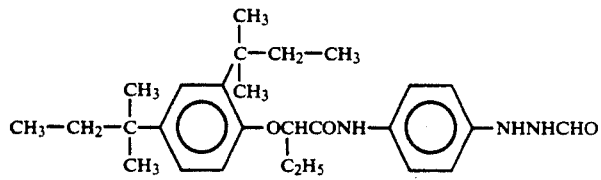
(9)

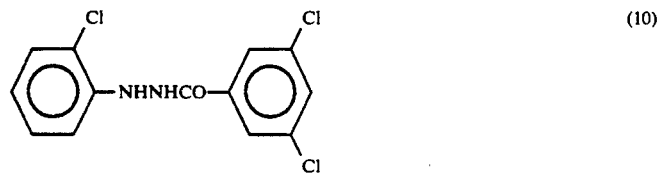
(10)

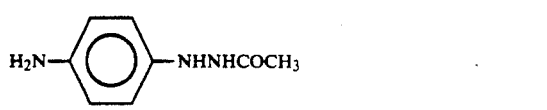
(11)

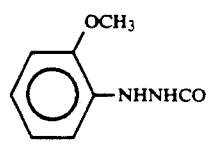
(12)

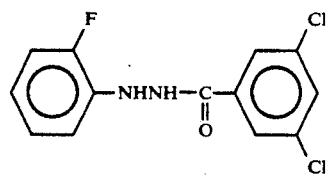
(13)

The reducing agent can be used in the light-sensitive material in an amount of wide range, but generally the amount thereof is in the range of 0.1 to 1,500 mole %, preferably in the range of 10 to 300 mole %, based on the amount of the silver salt.

In the present invention, pigment particles are used as the color image forming substance. The pigment particles are preferred since the forms a stable color image as is described in Japanese Patent Provisional Publication No. 62(1987)-187346.

As the pigment used in the invention, there can be mentioned not only those commercially available but also those described in various literatures such as "Handbook of Color Index (C. I.) ", Nippon Ganryo Gijutsu Kyokai (ed.), "New Handbook of Pigments (1977)", CMC Shuppan (ed.), "New Application and Technique of Dyes (1986)", and CMC Shuppan (ed.), "Printing Ink Technique (1984)".

The pigments can be classified based on the color difference into white pigment, black pigment, yellow pigment, orange pigment, brown pigment, red pigment, violet pigment, blue pigment, green pigment, fluorescent pigment, metallic powder pigment, and polymeric linking dyestuff. Examples of a pigment include insoluble azo pigment, azolake pigment, condensed azo pigment, chelate azo pigment, phthalocyanine pigment, anthraquinone pigment, perylene and perynone pigment, thioindigo pigment, quinacridone pigment, dioxadine pigment, isoindolinone pigment, quinophthalone pigment, color lake pigment, azine pigment, nitroso pigment, nitro pigment, natural pigment, fluorescent pigment and inorganic pigment.

The pigment particles used for the invention may have non-treated surface and may be surface treated. The methods of surface treatment include a method having the step of coating with a resin or a wax, a method having the step of attaching of a surface active agent or a method having the step of connecting an active substance (e.g., a silane coupling agent, an epoxy compound and polyisocyanate) onto the surface of the pigment. The methods are disclosed in "Nature and Application of Metallic Soap", Saiwai Shobo (ed.); "Printing Ink Technique", CMC Shuppan (ed. 1984); and "New Application and Technique of Pigment", CMC Shuppan (ed. 1986).

The diameter of the pigment particles preferably is in the range of 0.01 to 10 μm, more preferably 0.05 to 1 μm in the measurement after the particles are dispersed in the polymerizable compound.

The pigment is preferably used in an amount of 5 to 60 parts by weight, based on 100 parts by weight of the polymerizable compound.

The pigment particles can be dispersed in the same manner as in a known dispersing technique such as preparation of ink or toner.

Various dispersing devices are available. Examples of the dispersing device include a sand mill, an attritor, a pearl mill, a supermill, a ball mill, an impeller, a disperser, a KD mill, a colloid mill, a dynatron, a three-rolls mill and a pressure kneader. The dispersing devices are described in "New Application and Technique of Pigment", CMC Shuppan (ed. 1986).

The polymerizable compounds used in the light-sensitive material are compounds having an ethylenically unsaturated group.

Examples of the compounds having an ethylenic unsaturated group which can be used for the light-sensitive material include acrylic acids, salts of acrylic acids, acrylic esters, acrylamides, methacrylic acid, salts of methacrylic acids, methacrylic esters, methacrylamides, maleic anhydride, maleic esters, itaconic esters, styrenes, vinyl ethers, vinyl esters, N-vinyl heterocyclic compounds, allyl ethers, allyl esters, and derivatives thereof.

Concrete examples of the acrylic esters, which are preferably used, include n-butyl acrylate, cyclohexyl acrylate, 2-ethylhexyl acrylate, benzyl acrylate, furfuryl acrylate, ethoxyethoxyethyl acrylate, tricyclodecanyloxyl acrylate, nonylphenyloxyethyl acrylate, 1,3-dioxolan acrylate, hexanediol diacrylate, butanediol diacrylate, neopentylglycol diacrylate, tricyclodecandimethylol diacrylate, trimethylolpropane triacrylate, pentaerythritol tetraacrylate, dipentaerythritol pentaacrylate, dipentaerythritol hexacrylate, diacrylate of polyoxyethylenated bisphenol A, 2-(2-hydroxy-1,1-dimethylethyl)-5-hydroxymethyl-5-ethyl-1,3-dioxane diacrylate, 2-(2-hydroxy-1,1-dimethylethyl)-5,5-dihydroxymethyl-1,3 -dioxane triacrylate, triacrylate of propyleneoxide addition product of trimethylolpropane, polyacrylate of hydroxypolyether, hexaacrylate of carprolactone addition product of dipentaerythritol, polyacrylate of hydroxypolyether, polyester acrylate and polyurethane acrylate.

Examples of the methacrylic esters include methyl methacrylate, butyl methacrylate, ethylene glycol dimethacrylate, butanediol dimethacrylate, neopentylglycol dimethacrylate, trimethylolpropane trimethacrylate, pentaerythritol trimethacrylate, pentaerythritol tetramethacrylate and dimethacrylate of polyoxyalkylenated bisphenol A.

The polymerizable compounds can be used singly or in combination of two or more compounds. A light-sensitive material using two or more polymerizable compounds in combination is disclosed in Japanese Patent Provisional Publication No. 62(1987)-210445. Further, polymerizable compounds in which a polymerizable functional group such as a vinyl group or a vinylidene group is introduced into a chemical structure of the below-described reducing agent can be also employed as the polymerizable compound.

The development and polymerization reactions smoothly proceed in alkaline conditions. Therefore, the light-sensitive material contains a base or a base precursor as an image formation accelerator.

The light-sensitive materials of which light-sensitive layer contains a base or a base precursor are described in Japanese Patent Provisional Publication No. 62(1987)-264041.

In this case, a base precursor, which can release a base when it is heated, is preferably used in view of stability.

The base precursor used in the present invention includes various inorganic or organic compounds (decarboxylation type, thermal decomposition type, reaction type and complex salt-formation type).

Preferred examples of the base precursors include salts of organic acids and bases which decarboxylate under heating as described in Japanese Patent Provisional Publications No. 59(1984)-180549, No. 59(1984)-180537, No. 59(1984)-195237, No. 61(1986)-32844, No. 61(1986)-36743, No. 61(1986)-51140, No. 61(1986)-52638, No. 61(1986)-52639, No. 61(1986)-53631, No. 61(1986)-53634, No. 61(1986)-53635, No. 61(1986)-53636, No. 61(1986)-53637, No. 61(1986)-53638, No. 61(1986)-53639, No. 61(1986)-53640, No. 61(1986)-55644, No. 61(1986)-55645, No. 61(1986)-55646, No. 61(1986)-84640, No. 61(1986)-107240, No. 61(1986)-219950, No. 61(1986)-251840, No. 61(1986)-252544, No. 61(1986)-313431, No. 63(1988)-316740 and No. 64(1989)-68746, and Japanese Patent Application No. 62(1987)-209138; and compounds releasing bases under heating as described in Japanese Patent Provisional Publications No. 59(1984)-157637, No. 59(1984)-166943 and No. 63(1988)-96159.

The base precursor employable in the invention preferably releases a base at a temperature ranging from 50° to 200° C., more preferably from 80° to 180° C.

The base precursor preferably has a solubility in water of not more than 1% at 25° C. to be incorporated into microcapsules. Followings are such preferable base precursors.

(a) A base precursor composed of a salt of an organic base with a carboxylic acid; wherein the organic base is a diacidic, triacidic or tetraacidic base which composed of two to four amidine moieties and at least one residue of a hydrocarbon or a heterocyclic ring as a linking group of the amidine moieties, and each of the amidine moieties corresponds to an atomic group formed by removing one or two hydrogen atoms from the amidine having the following formula (VI).

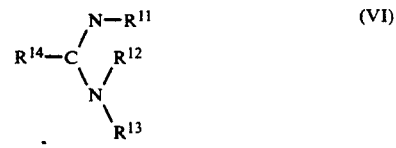

[In the formula (VI), each of $R^{11}$, $R^{12}$, $R^{13}$ and $R^{14}$ independently is a monovalent group selected from the group consisting of hydrogen, an alkyl group, an alkenyl group, an alkynyl group, a cycloalkyl group, an aralkyl group, an aryl group and a heterocyclic group, each of which may have one or more substituent group; and any two of $R^{11}$, $R^{12}$, $R^{13}$ and $R^{14}$ may be combined together to form a five-membered or six-membered nitrogen-containing heterocyclic ring.]

(b) A base precursor composed of a salt of an organic base with a carboxylic acid; wherein the organic base is a diacidic, triacidic or tetraacidic base which composed of two to four guanidine moieties and at least one residue of a hydrocarbon or a heterocyclic ring as a linking group of the guanidine moieties, and each of the guanidine moieties corresponds to an atomic group formed by removing one or two hydrogen atoms from the guanidine having the following formula (VII).

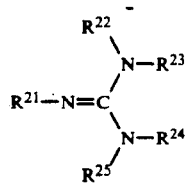
(VII)

[In the formula (II), each of $R^{21}$, $R^{22}$, $R^{23}$, $R^{24}$ and $R^{25}$ independently is a monovalent group selected from the group consisting of hydrogen, an alkyl group, an alkenyl group, an alkynyl group, a cycloalkyl group, an aralkyl group, an aryl group and a heterocyclic group, each of which may have one or more substituent group; and any two of $R^{21}$, $R^{22}$, $R^{23}$, $R^{24}$ and $R^{25}$ may be combined together to form a five-membered or six-membered nitrogen-containing heterocyclic ring.]

The base precursors of (a) and (b) are described in detail in Japanese Patent Provisional Publications No. 63(1988)-31670 and No. 64(1989)-68746.

Examples of the base precursors are given below, but these examples do not restrict base precursors employable in the invention.

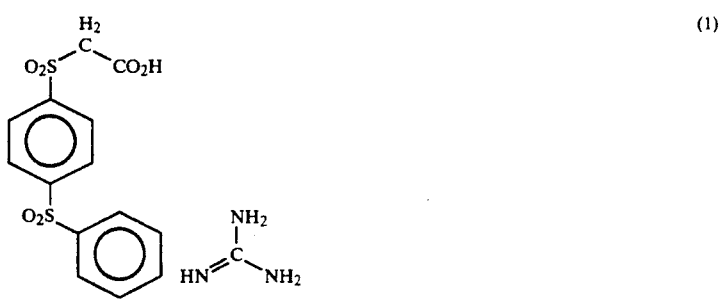
(1)

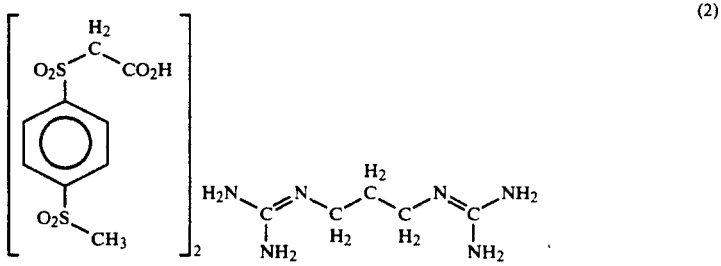
(2)

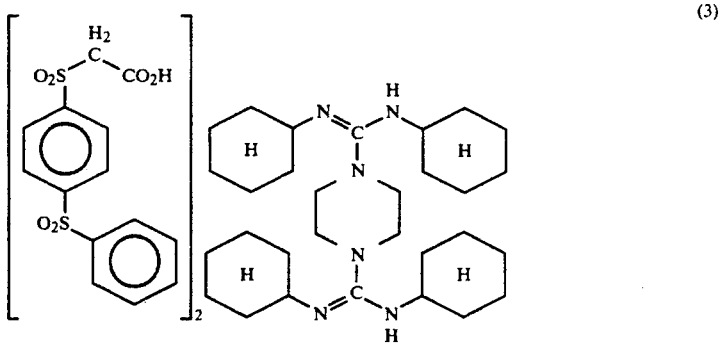
(3)

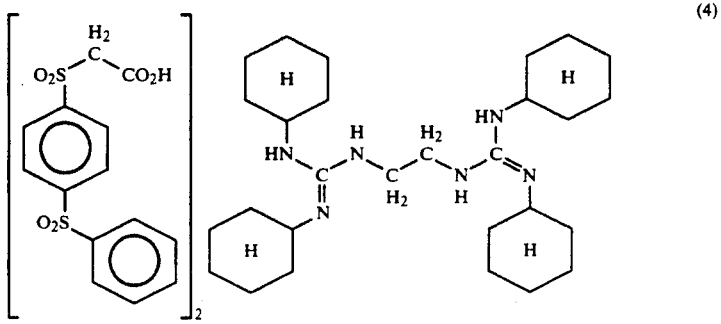
(4)

-continued
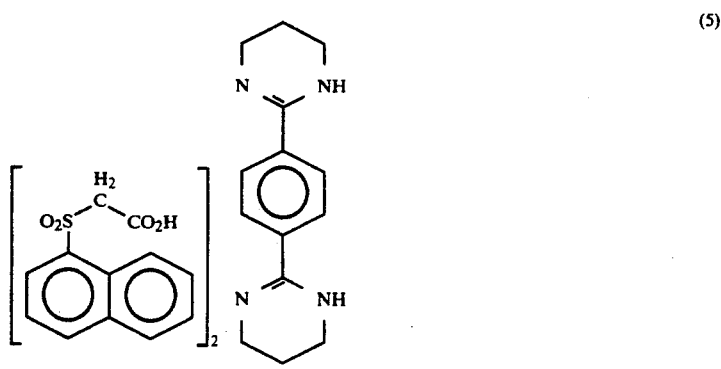 (5)
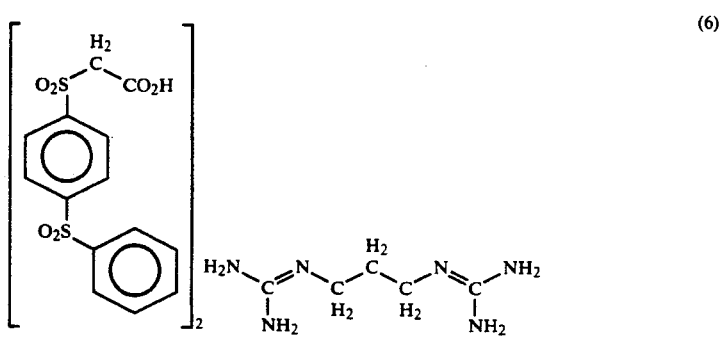 (6)
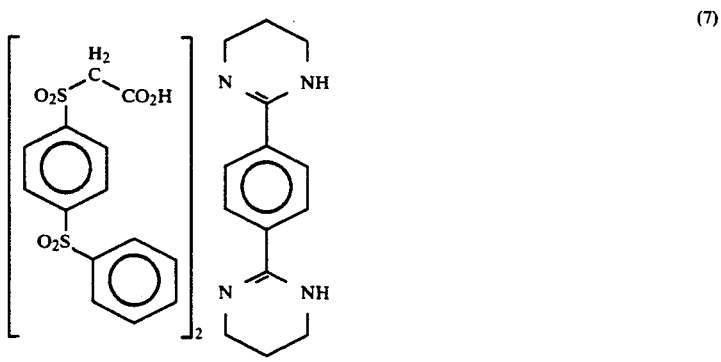 (7)
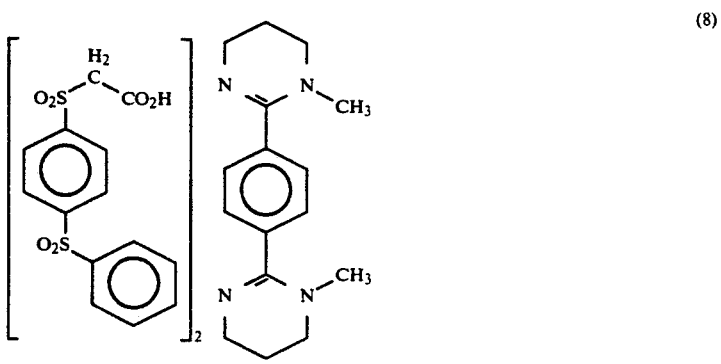 (8)

-continued

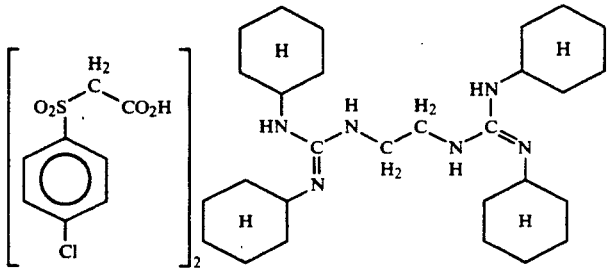
(9)

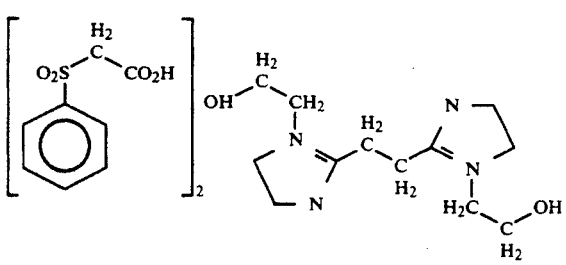
(10)

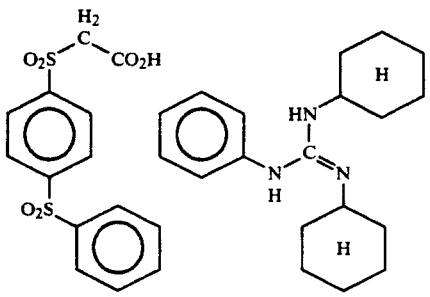
(11)

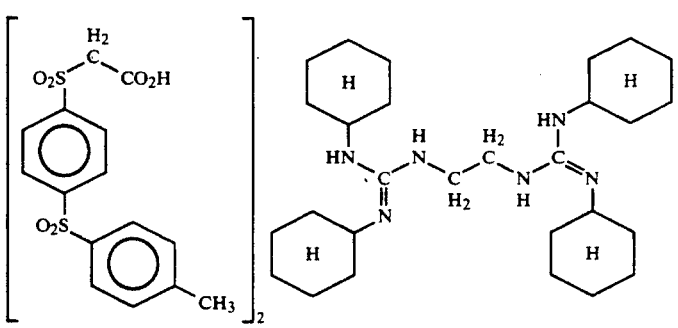
(12)

In preparation of the microcapsules, a solid base precursor may be directly dispersed in a polymerizable compound (see: Japanese Patent Provisional Publications No. 64(1989)-32251 and No. 1(1989)-263641). However, it is particularly preferred that a base precursor be dispersed in water, and that the dispersion be then emulsified in a polymerizable compound (see: Japanese Patent Provisional Publications No. 63(1989)-218964 and Japanese Patent Applications No. 1(1989)-182245 and No. 1(1989)-160148).

In this case, a nonionic or amphoteric water soluble polymer is preferably dissolved in water in which the base precursor is dispersed.

Examples of the nonionic water soluble polymer include polyvinyl alcohol, polyvinyl pyrrolidone, polyacrylamide, polymethylvinyl ether, polyacryloylmorpholine, polyhydroxyethylacrylate, polyhydroxyethylmethacrylate-co-acrylamide, hydroxyethyl cellulose, hydroxypropyl cellulose and methylcellulose. An example of the amphoteric water soluble polymer is gelatin.

The water soluble polymer is preferably used in an amount of 0.1 to 100 weight % based on the amount of the base precursor, and more preferably 1 to 50 weight %. The base precursor is preferably contained in the dispersion in an amount of 5 to 60 weight %, and more preferably of 10 to 50 weight %. The base precursor is preferably used in an amount of 2 to 50 weight % based on the amount of the polymerizable compound, and more preferably 5 to 30 weight %.

A hydrophilic compound is preferably dissolved in a polymerizable compound to reduce the solubility of the base precursor in the polymerizable compound. Examples of the hydrophilic group of the compound include —OH, —SO$_2$NH$_2$, —CONH$_2$ and —NHCONH$_2$. Examples of the hydrophilic compound include polyethylene glycol, polypropylene glycol, benzoic amide, cyclohexylurea, octyl alcohol, dodecyl alcohol, stearyl alcohol and stearamide.

With respect to the support employable in the invention, materials having good heat conductivity are preferably used because the light-sensitive material is heated from the side of the support (i.e., the side on which the light-sensitive layer is not provided) in the developing stage.

Examples of the materials employable for the preparation of the support include glasses, ordinary papers, fine paper, coat paper, cast-coat paper, synthetic papers, metals and analogues thereof, films (e.g., polyester) on which metals (e.g., aluminum) are deposited, various films made of polyester, polyethylene, polypropylene, acetyl cellulose, cellulose ester, polyvinyl acetal, polystyrene, polycarbonate, polyethylene terephthalate and polyimide, and papers laminated with resin or polymer (e.g., polyethylene).

Among them, the support is preferably made of a polymer film. The thickness of the support is not more than 50 μm in view of the above-mentioned heat conductivity.

The image forming method of the invention comprises at least the steps of imagewise exposing, heating and pressing the material, and therefore the light-sensitive material is preferably used in the form of a continuous film. Since the continuous film of the material is subject to operations such as transferring, heating, pressing and rolling up, the physical strength and thermal properties to endure the operations are desired.

From the above-mentioned point of view, a polymer film is preferably used for the support in view of the physical strength (e.g., tensile strength, elasticity, rigidity, etc.), and further the film having the thickness of not more than 50 μm, which has good heat conductivity, is particularly preferable. A film having the thickness of more than 50 μm has poor heat conductivity, and therefore it is difficult to shorten the development process. On the other hand, a film having the thickness of less than 5 μm is not preferable in view of the physical strength.

To provide a light-sensitive layer onto the support, it is particularly preferred that an undercoating layer described in Japanese Patent Provisional Publication 61(1986)-113058 be provided or that an aluminum film be deposited onto the polymer support.

Therefore, the most preferable support used for the present invention is a polymer film of which thickness is not more than 50 μm and onto which an aluminum film is provided.

Optionally employable components used for the light-sensitive material of the invention are described below.

The binder employable for the light-sensitive material can be included in the light-sensitive layer singly or in combination. A water-soluble binder is preferably employed. A typical water-soluble binder is transparent or semi-transparent one, of which examples include natural substances such as gelatin, gelatin derivatives, cellulose derivatives, starch and gum arabic; and synthetic polymer substances such as polyvinyl alcohol, polyvinyl pyrrolidone and water-soluble polyvinyl compound (e.g., acrylamide polymer).

One of the other examples of synthetic polymer substances is a dispersing vinyl compound which increases the size-stability of photographic materials in form of latex. A light-sensitive material using a binder is described in Japanese Patent Provisional Publication No. 61(1986)-69062, and a light-sensitive material using a binder and microcapsules together with is described in Japanese Patent Provisional Publication No. 62(1987)-209525.

An organometalic salt can be used as an oxidizing agent in combination with silver halide in the invention. An organic silver salt is most preferably employed.

Examples of an organic compound employable for forming such organosilver salt oxidizing agent include benzotriazoles, aliphatic acids and other compounds described in U.S. Pat. No. 4,500,626 (columns 52-53). Also effectively employable are silver salts of carboxylic acids having alkynyl group (e.g., silver phenylpropionate) described in Japanese Patent Provisional Publication No. 60(1985)-113235 and acetylene silver salt described in Japanese Patent Provisional Publications No. 61(1986)-349044 and No. 64(1989)-57256. The organic silver salts can be used singly or in combination of two or more kinds.

The above-mentioned organic silver salt can be used in combination with a light-sensitive silver halide in an amount of 0.01 to 10 mole, preferably 0.01 to 1 mole, per 1 mole of the silver halide. The total amount of the organic silver salt and the silver halide is generally within a range of 1 mg/m$^2$–10 g/m$^2$ in terms of the amount of silver metal.

The antismudging agent employable for the light-sensitive material is preferably used in form of solid grains at room temperature. Concrete examples of the antismudging agent employable for the light-sensitive material include starch grains described in U.K. Patent No. 1,232,347, fine powder of polymer U.S. Pat. No. 3,625,736, microcapsules containing no color developing agent described in U.K. Patent No. 1,235,991, fine powder of cellulose described in U.S. Pat. No. 2,711,357 and inorganic grains such as talc, kaolin, bentonite, pagodite, zinc oxide, titanium oxide, alumina. A mean grain size of the above-mentioned grains is preferably within the range of 3 to 50 μm, more preferably 5 to 40 μm, in terms of volume mean diameter. In the case where oily droplets are encapsulated, it is effective that the size of the grain is larger than that of the microcapsules.

Various image formation accelerators are employable for the light-sensitive material.

Image formation accelerators have the functions such as 1) accelerating the transfer of a base or a base precursor, 2) accelerating the reaction of a reducing agent and a silver salt, 3) accelerating the passivating reaction of coloring substances by polymerization. From a viewpoint of physical chemistry concerning the functions, the image formation accelerators can be classified into base or base precursor, nucleophilic compounds, oils, heat solvents, surface active agents, compounds having interactions with silver or silver salts, compounds having deoxidization function and other compounds. However, these substances generally have complex functions, so each of them usually has some acceleration effects, which are described in U.S. Pat. No. 4,678,739 (columns 38-40) and Japanese Patent Provisional Publication No. 62(1987)-209443 in detail.

In the system wherein the polymerizable compound is polymerized within the area where a latent image of silver halide is not formed, a thermal polymerization initiator or a photopolymerization initiator may be contained in the light-sensitive layer. Further, the thermal polymerization initiator or the photopolymerization initiator may also be contained in the image-receiving material to harden the transferred image.

Examples of the thermal polymerization initiator include azo compounds, organic peroxides, inorganic peroxides and sulfinic acids. The thermal polymerization initiator is described in "Addition Polymerization and Ring Opening Polymerization", pp.6–18, edited by the Editorial Committee of High Polymer Experimental Study of the High Polymer Institute, published by Kyoritsu Shuppan (1983).

Examples of the photopolymerization initiator include benzophenones, acetophenones, benzoins and thioxanthones. The photopolymerization initiator is described in "Ultraviolet Ray Hardening System", pp.63–147, edited by the General Technical Center (1989).

Various surface active agents are employable for the light-sensitive material for various purposes, such as aiding the coating process, increasing facility of peeling off, increasing slipperiness, preventing electrification and accelerating development. Concrete examples of the surface active agent are described in Japanese Patent Provisional Publications No. 62(1987)-173463 and No. 62(1987)-183457.

An antistatic agent is employable for the light-sensitive materials to prevent electrifying. Antistatic agents are described in Research Disclosure Vol. 176, No. 17643, pp. 27 (Nov. 1978).

To prevent halation and irradiation, a dye or a pigment may be added to the light-sensitive layer of the light-sensitive materials. The light-sensitive material of which light-sensitive layer contains a white pigment is described in Japanese Patent Provisional Publication No. 63(1988)-29748.

The microcapsules may contain a coloring matter having a property of being decolored by heating or irradiation with light. The coloring matter having a property of being decolored by heating or irradiation with light can play the role corresponding to yellow filter in the conventional silver salt photography system. The light-sensitive material using such coloring matter having a property of being decolored by heating or irradiation with light is described in Japanese Patent Provisional Publication No. 63(1988)-974940.

In the case where a solvent of a polymerizable compound is used for the light-sensitive material, the solvent is preferably contained in microcapsules other than those containing polymerizable compound. The light-sensitive material using an organic solvent compatible with a polymerizable compound contained in microcapsules is described in Japanese Patent Provisional Publication No. 62(1987)-209524. Silver halide grains adsorbing water soluble vinyl polymer can be also employed. Such light-sensitive material using water soluble vinyl polymer is described in Japanese Patent Provisional Publication No. 62(1987)-91652.

Other optional components which can be contained in the light-sensitive layer are described in Research Disclosure Vol. 170, No. 17029, pp. 9–15 (Jun. 1978) and the above-described publications.

Examples of an optional layer provided in a light-sensitive material include an image-receiving layer, a heating layer, an anti-electrifying layer, an anti-curling layer, a peeling layer, a cover sheet or a protective layer and an anti-halation layer (a coloring layer).

The light-sensitive materials having a heating layer, having a cover sheet or a protective layer and having an anti-halation layer (a coloring layer) are described in Japanese Patent Provisional Publications No. 61(1986)-294434, No. 62(1987)-210447 and No. 63(1988)-101842, respectively. Further, other optional layers and their concrete embodiments are described in the above-mentioned publications.

Various anti-fogging agents and photographic stabilizers are employable for the light-sensitive material of the invention. Examples of them include azoles and azaindenes described in Research Disclosure No. 17643, pp. 24–25 (1978), nitrogen containing carbonic acids and phosphoric acids described in Japanese Patent Provisional Publication No. 59(1984)-168442, mercapto compounds and their salts with metals described in Japanese Patent Provisional Publication No. 59(1984)-111636 and acetylene compounds described in Japanese Patent Provisional Publication No. 62(1987)-87957.

Various development terminators can be employable for the light-sensitive materials to obtain an image of constant quality independent of the temperature and the process of development treatment.

In the specification, "a development terminator" means a compound which interacts with silver or silver salts to inhibit the development, or a compound which neutralizes or reacts with a base to reduce the base concentration to terminate the development. Concrete examples of a development terminator include an acid precursor which emits an acid by heating, an electrophilic compound which substitutes a chlorine atom existing together with by heating, a nitrogen-including heterocyclic compound, a mercapto compound and a precursor thereof. With respect to the development terminator, more detailed descriptions are described in Japanese Patent Provisional Publication No. 62(1987)-253159 (pp. 31–32), Japanese Patent Applications No. 1(1989)-72479 and No. 1(1989)-3471.

An image-receiving material is described below.

The image-receiving material may comprise a support alone, but preferably an image-receiving layer is provided on the support.

A support of the image-receiving material is not particularly restricted, and materials for the above-described support of a light-sensitive material can be also employed. Examples of them include glasses, ordinary papers, fine paper, coat paper, cast-coat paper, synthetic papers, metals and analogues thereof, various films made of polyester, polyethylene, polypropylene, acetyl cellulose, cellulose ester, polyvinyl acetal, polystyrene, polycarbonate, polyethylene terephthalate and polyimide, and papers laminated with resin or polymer (e.g., polyethylene).

In the case where a porous material such as paper is used as a support of an image-receiving material, the surface of the material preferably has a certain smoothness (see: Japanese Patent Provisional Publication No. 62(1987)-209530). An image-receiving material using a transparent support is described in Japanese Patent Provisional Publication No. 62(1987)-209531.

An image-receiving layer of an image-receiving material comprises a white pigment, a binder and other additives. A white pigment itself or space among the white pigment grains accepts a polymerizable compound.

Examples of the white pigment employable for an image-receiving layer include inorganic white pigments such as oxides (e.g., silicon oxide, titanium oxide, zinc oxide, magnesium oxide and aluminum oxide), salts of alkaline earth metals (magnesium sulfate, barium sulfate, calcium sulfate, magnesium carbonate, barium carbonate, calcium carbonate, calcium silicate, magnesium hydroxide, magnesium phosphate and magnesium hydrogenphosphate), aluminum silicate, aluminum hydroxide, zinc sulfide, various kinds of clay, talc, kaolin, zeolite, acid clay, soluble clay and glass; organic white pigments such as polyethylene, polystyrene, benzoguanamine resin, urea-formalin resin, melamine-formalin resin and polyamide resin. The white pigment above-described can be used in the invention singly or in combination. A white pigment which can absorb a high amount of a polymerizable compound is preferably used.

As the binder, a water-soluble polymer, a polymer latex and a polymer soluble in an organic solvent are employed. Examples of the water-soluble polymer include cellulose derivatives such as carboxymethylcellulose, hydroxyethylcellulose and methylcellulose; proteins such as gelatin, phthalated gelatin, casein and egg albumin; starch and its derivatives such as dextrin and etherificated starch; synthetic polymers such as polyvinyl alcohol, partial acetal of polyvinyl alcohol, poly-N-vinyl pyrrolidone, polyacrylic acid, polymethacrylic acid, polyacrylamide, polyvinyl imidazole, polyvinyl pyrazole and polystyrenesulfonic acid; and others such as locust bean gum, pullulan, gum arabic and sodium alginate.

Examples of the polymer latex include styrene-butadiene copolymer latex, methyl methacrylate-butadiene copolymer latex, polyacrylate latex, polymethacrylate latex, acrylate-methacrylate copolymer latex and ethylene-vinyl acetate copolymer latex.

Examples of the polymer soluble in an organic solvent include polyester resin, polyurethane resin, polyvinyl chloride resin and polyacrylonitrile resin.

The binders can be used singly or in combination. A combination of two or more binders can be employed to cause a phase separation in the image-receiving layer (see: Japanese Patent Provisional Publication No. 1(1989)-154789).

A grain size of the white pigment is within a range of 0.1 to 20 $\mu$m, preferably 0.1 to 10 $\mu$m. The amount of the pigment is in the range of 0.1 to 60 g, preferably 0.5 to 30 g. The weight ratio of the white pigment to a binder preferably is in the range of 0.01 to 0.4, and more preferably 0.03 to 0.3.

The image-receiving layer may further contain various components other than the white pigment and the binder.

For example, a color developer can be contained in the image-receiving layer in a color formation system in which a color former and the color developer are used. Examples of the color developer include phenols, organic acids and salts, and esters. Zinc salt of a salicylic acid derivative is preferred in the case where a leuco dye is used as a color image forming substance (color former). Zinc salt of 3,5-di-$\alpha$-methylbenzylsalicylic acid is particularly preferred.

The color developer is preferably contained in the image-receiving layer in a coating amount of 0.1 to 50 g/m$^2$, and more preferably 0.5 to 20 g/m$^2$.

A thermoplastic compound may be contained in the image-receiving layer. In the case where the thermoplastic compound is contained in the image-receiving layer, the image-receiving layer itself is preferably composed of an agglomerate of fine particles of the thermoplastic compound (i.e., granular thermoplastic compound). The image-receiving layer having this constitution has such advantages that the formation of a transferred image can be readily done and that a glossy image can be obtained under heating after the image formation. There is no specific limitation on the thermoplastic compounds, and any known thermoplastic resins (plastics) and waxes can be employed.

The glass transition point of the thermoplastic resin or the melting point of the wax is preferably not higher than 200° C. The above-mentioned image-receiving material having the image-receiving layer containing fine particles of the thermoplastic compound is described in Japanese Patent Provisional Publications No. 62(1987)-280071 and No. 62(1987)-280739.

A photopolymerization initiator or a thermal polymerization initiator may be contained in the image-receiving layer. In the image forming method using the image-receiving material, the color image forming substance is transferred onto the image-receiving material together with the unpolymerized polymerizable compound. Therefore, the photopolymerization initiator or the thermal polymerization initiator can be incorporated into the image-receiving layer to cure the unpolymerized polymerizable compound smoothly. The image-receiving material having the image-receiving layer containing a photopolymerization initiator is described in Japanese Patent Provisional Publication No. 62(1987)-161149, and the material having the image-receiving layer containing a thermal polymerization initiator is described in Japanese Patent Provisional Publication No. 62(1987)-210444.

Next, below described are the steps of the image forming method. The steps include: imagewise exposing the light-sensitive material; simultaneously or thereafter heating the material preferably from the side of the support (the side on which the light-sensitive layer is not provided); superposing and pressing a light-receiving material on the surface of the light-sensitive layer provided on the light-sensitive material.

Various exposure means can be employed in the image-wise exposure, and generally the light-sensitive material is imagewise exposed to a radiation containing visible light to obtain a latent image of the silver halide. The kind of light source or the amount of radiation employed in the exposure can be selected depending on a light-sensitive wavelength (or intensified wavelength in the case of spectral sensitization) of the silver halide and a sensitivity of the light-sensitive material.

Examples of the radiation include natural light, ultraviolet light, visible light and infrared light. Examples of such low energy radiation light source include a fluorescent lamp, a tungsten lamp, a halogen lamp, a xenor: flash lamp, various lasers (e.g., a gas laser, a solid laser, a chemical laser and a semiconductor laser), a light emission diode, a plasma emitting tube and FOT. A high energy radiation such as X-ray, $\gamma$-ray and electron beam is also available in special cases.

In the case where a full color image is formed, the light-sensitive material contains two or more microcapsules which are different from each other with respect to the spectral sensitivity. Accordingly, the light-sensitive material is exposed to two or more spectral lights to form a full color image.

The light source should be selected in consideration of the light-sensitive wavelength as is mentioned above. Further, it is preferably considered whether the image information is converted into an electrical signal or not (digital or analog). The processing speed of the system, the size of the image recording apparatus and the electric power of the apparatus are also important factors in the selection of the light source.

In the case where the image information is not converted into an electrical signal (for example, when a subject such as a landscape and a portrait is directly photographed, when an original image is directly copied, or when a positive such as a reversal film is exposed to light), exposure devices for a camera, a printer, an enlarging apparatus and a copying machine are available. A two-dimensional image can be exposed to light by one shot using these exposure devices. Further, the image can also be scanned through a slit. An original image can be enlarged or reduced. In this case, a fluorescent lamp or a tungsten lamp is a preferred light source. However, a monochromatic light such as a laser is also available if two or more lights are used in combination.

In the case where the image information is an electrical signal, two or more monochromatic lights such as a light emission diode or a laser can be used in combination as a light source. The combination is determined in consideration of the spectral sensitivity of the heat developing color light-sensitive material. Further, various known display devices (CRT, liquid crystal display, electroluminescence display, electrochromic display and plasma display) are also available. In this case, the image information is an image signal such as a signal obtained by a video camera or an electron still camera, a television signal (e.g., a signal regulated by Japan Television Signal Standards (NTSC)), a signal consisting of many image elements obtained by scanning an original image, and a signal stored in a recording material such as a magnetic tape or disk.

In the case of the exposure of a color image, two or more monochromatic lights are used in combination in consideration of the spectral sensitivity of the light-sensitive material. In this case, two or more light sources such as LED, a laser and a fluorescent lamp may be used in combination. The light sources may be the same or different. The spectral sensitivity of the light-sensitive material usually contains R (Red), G (Green) and B (Blue). Light sources of UV (Ultraviolet) and IR (Infrared) have also recently been available. In addition to the combination of R, G and B, examples of the combination of the spectral sensitivity include (G, R, IR), (R, short wave IR, long wave IR), (short wave UV, medium wave UV, long wave UV) and (UV, B, G). A combination of different light sources such as two kinds of LED and a laser is available.

A light emitting tube or element can be used in a scanning exposure with respect to individual colors. Arrays such as a LED array, a liquid crystal shutter array and a magneto-optical element shutter array can be used to increase the speed of the exposure.

The display devises such as CRT include a monochromatic device and a color device. If a multiple exposure is carried out using some filters, even a monochromatic device can form a color image. Such system is also available.

A conventional two-dimensional display device can be used as a one-dimensional device such as FOT. In the case where the display device and a scanner are used in combination, the displayed image can be divided into two or more parts.

In the above-mentioned imagewise exposure process, a latent image is formed in the silver halide contained in microcapsules.

Simultaneously or after the imagewise exposure process, a heating process to develop the image is carried out in the image forming method in which the light-sensitive material of the invention is used.

It is difficult to shorten the development process by conventional methods, therefore the light-sensitive material of the invention is heated from the side of the support (the side on which the light-sensitive layer is not provided).

Heating in the heat development process can be conducted in various known manners. For example, a heating layer which is arranged on the light-sensitive material can be used as the heating means (see: Japanese Patent Provisional Publication No. 61(1986)-294434). Further, the light-sensitive material can be heated on a hot plate, an iron or a heat roller (see: Japanese Patent Provisional Publication No. 61(1986)-144166). Furthermore, the material can be heated between a heat roller and a belt (see: Japanese Patent Provisional Publication No. 62(1987)-144166).

The whole surface of the light-sensitive material may be heated by a heater which is larger than the light-sensitive material. The light-sensitive material may also be heated by scanning the material with a small heater (e.g., hot plate, heat roller, heat drum).

Further, the light-sensitive material can be heated although the material is not in contact with a heater. For example, the light-sensitive material may be heated with an electromagnetic wave, an infrared ray or a hot air.

In the present invention, the light-sensitive material is preferably heated from the side of the support (the side on which the light-sensitive layer is not provided). The side of the light-sensitive layer is usually open to the air. However, the side of the layer may be covered with an adiabatic material to maintain the heating temperature. In this case, it is necessary to handle carefully the adiabatic: material. If the adiabatic material is pressed on the light-sensitive material at a high pressure (10 kg/cm$^2$ or more), the microcapsules contained in the light-sensitive layer tend to be ruptured.

After the light-sensitive material is imagewise exposed to light, the light-sensitive material is heated preferably at an interval of 0.1 second or more. The heating temperature usually ranges from 60° C. to 250° C., preferably from 80° C. to 180° C. The heating time is in the range of 0.1 to 5 seconds.

A color image can be obtained on an image-receiving material by pressing the light-sensitive material on the image-receiving material to transfer the unpolymerized polymerizable compound to the image-receiving material.

For applying a pressure to the light-sensitive material and the image-receiving material, any known pressing methods can be employed.

For example, the light-sensitive material and the image-receiving material may be sandwiched between press plates such as a presser or they may be transferred using a pressure roller such as a nip roll to apply a pressure to them. A dot-impact device can be also employed to give intermittently a pressure to them.

Otherwise, a pressure may be applied to the light-sensitive material and the image-receiving material by spraying a high-pressure air by means of an air gun or using an ultrasonic wave-generating device or a piezoelectric element.

The light-sensitive material and the image-receiving material are pressed at a pressure of not less than 20 kg/cm², and preferably not less than 50 kg/cm². The temperature for pressing the materials is in the range of 30° to 130° C., and preferably 50° to 90° C.

The image forming method of the invention can be used for color photography, printing and copy (e.g., computer-graphic hard copy and xerox copy). The present invention provides a compact and inexpensive image forming system such as a copying machine and a printer.

EXAMPLE 1

Preparation of Silver Halide Emulsion (EB-1)

To distilled water was added 20 g of lime-treated inert gelatin and the gelatin was dissolved in water at 40° C. over 1 hour. To the resulting solution was added 3 g of NaCl, and then the pH value was adjusted to 3.2 using 1N-sulfuric acid.

To the obtained gelatin solution, the following Liquids I and II were added simultaneously at the same feed rate at the constant pAg value of 8.5 at 60° C. over 45 minutes according to the control double jet method. After that, the pH value was adjusted to 6.0 using 1N NaOH and then 4.8 g of the following compound (ATR-1) and 480 mg of the following compound (SB-1) were added. After 20 minutes, to the resulting mixture was further added 100 g of an aqueous solution containing 4.1 g of KI at the same feed rate over 10 minutes.

To the resulting emulsion was then added 1.1 g of the following compound (CK-1) to form sediment. After the emulsion was washed with water for desalting, 6 g of lime-treated gelatin was added and dissolved in the emulsion. Then, to the emulsion was further added 3 cc of 72% of aqueous solution of the following compound (ATR-1) so that the pH value might be adjusted to 6.2. Thus, a monodispersed tetradecahedral silver iodobromide emulsion (EB-1) (yield: 520 g, mean grain size: 0.22 μm, distribution coefficient: 22%) was prepared.

| Liquid I: | AgNO₃ | 120 g |
| | distilled water | 550 cc |
| Liquid II: | KBr | 85 g |
| | distilled water | 550 cc |

Preparation of Silver Halide Emulsion (EG-1)

The procedure of the preparation of silver halide emulsion (EG-1) was repeated except that Liquids I and II were added over 25 minutes and that 430 mg of the following compound (SG-1) was added instead of the compound (SB-1).

Thus, a monodispersed silver iodobromide emulsion (EG-1) (yield: 550 g, mean grain size: 0.18 μm, distribution coefficient: 24%) was prepared.

Preparation of Silver Halide Emulsion (ER-1)

The procedure of the preparation of silver halide emulsion (EG-1) was repeated except that 450 mg of the following compound (SR-1) and 100 mg of the following compound (SR-3) were added instead of the compound (SG-1).

Thus, a monodispersed silver iodobromide emulsion (ER-1) (yield: 550 g, mean grain size: 0.18 μm, distribution coefficient: 22%) was prepared.

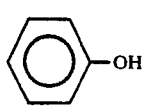

(ATR-1)

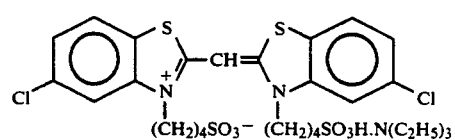

(SB-1)

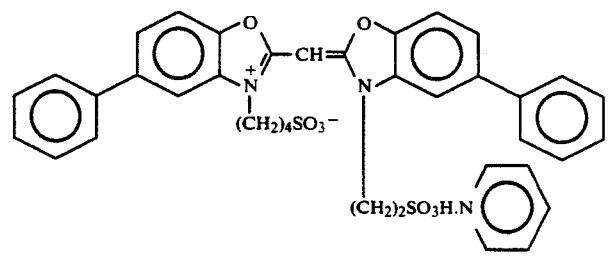

(SG-1)

poly(isobutylene-co-monosodium maleate)   (CK-1)

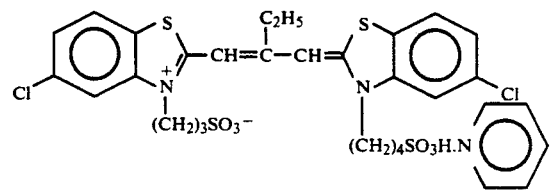

(SR-1)

-continued

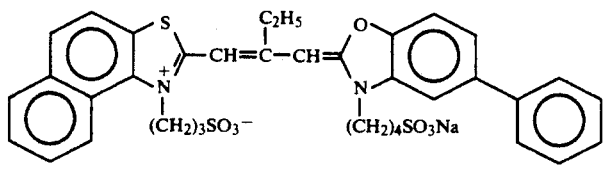
(SR-3)

Preparation of Solid Dispersion (KB-1)

Into a 300 ml dispersion container were added 110 g of 5.4% aqueous solution of lime-treated gelatin, 20 g of 5% aqueous solution of polyethylene glycol (average molecular weight: 2,000), 70 g of the base precursor (BG-1) and 200 ml of glass beads of which diameters were within a range of 0.5–0.75 m. The resulting mixture was stirred at 3,000 r.p.m. for 20 minutes using a Dynomill, and then the pH value was adjusted to 6.5 using 2N sulfuric acid to obtain a solid dispersion (KB-1) of the base precursor (BG-1) of which grain size was not more than 1.0 μm.

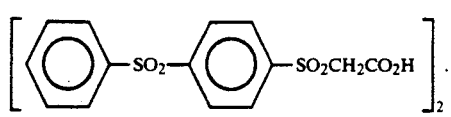
(BG-1)

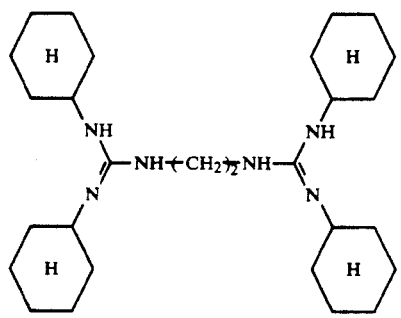

Preparation of Pigment Dispersion (GY-1)

To 255 g of the polymerizable compound (MN-2) was added 45 g of Microlith Yellow 4GA (tradename, available from Ciba-Geigy). The resulting mixture was stirred at 5,000 r.p.m. for 1 hour using Eiger Motor Mill (tradename of Eiger Engineering) to obtain a pigment dispersion (GY-1).

Preparation of Pigment Dispersion (GM-1)

In 255 g of the polymerizable compound (MN-2) were added 45 g of Microlith Red 3RA (tradename, available from Ciba-Geigy) and 4.5 g of Solsperse 24000 (tradename of ICI). The mixture was stirred at 5,000 r.p.m. using Eiger Motor Mill (tradename of Eiger Engineering) for 1 hour to obtain a pigment dispersion (GM-1).

Preparation of Pigment Dispersion (GC-1)

In 255 g of the polymerizable compound (MN-1) were added 45 g of copper phthalocyanine (C.I. Pigment 15), 1.13 g of Solsperse 5000 (tradename of ICI) and 3.37 g of Solsperse 24000 (tradename of ICI). The mixture was stirred at 5,000 r.p.m. using Eiger Motor Mill (tradename of Eiger Engineering) for 1 hour to obtain a pigment dispersion (GC-1).

Preparation of Light-Sensitive Composition (PB-1)

To 45 g of the pigment dispersion (GY-1) were dissolved 9 g of 20 wt. % solution of copolymer (1P-1) in (SV-1), 2.3 g of (RD-1), 6.2 g of (RD-2), 1.0 g of 0.5 wt. % solution of (AT-1) in (SV-1) and 5.0 g of (ST-1).

To the resulting oily solution, 3.8 g of the silver halide emulsion (EB-1) and 24 g of the solid dispersion (KB-1) were added, and the resulting mixture was stirred at 10,000 r.p.m. for 5 minutes at 60° C. using a dissolver of 40φ to obtain a light-sensitive composition (PB-1) in the form of a W/O emulsion.

Preparation of Light-Sensitive Composition (PG-1)

To 45 g of the pigment dispersion (GM-1) were dissolved 9 g of 20 wt. % solution of copolymer (1P-1) in (SV-1), 2.3 g of (RD-1), 3.1 g of (RD-2), 1.0 g of 0.5 wt. % solution of (AT-1) in (SV-1) and 5.0 g of (ST-1).

To the resulting oily solution, 3.8 g of the silver halide emulsion (EG-1) and 24 g of the solid dispersion (KB-1) were added, and the resulting mixture was stirred at 10,000 r.p.m. for 5 minutes at 60° C. using a dissolver of 40φ to obtain a light-sensitive composition (PG-1) in the form of a W/O emulsion.

Preparation of Light-Sensitive Composition (PR-1)

To 45 g of the pigment dispersion (GC-1) were dissolved 9 g of 20 wt. % solution of copolymer (1P-1) in (SV-1) 2.3 g of (RD-1), 6.2 g of (RD-2), 1.0 g of 0.5 wt. % solution of (FF-3) in (SV-1) and 5.0 g of (ST-1).

To the resulting oily solution, 3.8 g of the silver halide emulsion (ER-1) and 24 g of the solid dispersion (KB-1) were added, and the resulting mixture was stirred at 10,000 r.p.m. for 5 minutes at 50° C. using a dissolver of 40φ obtain a light-sensitive composition (PR-1) in the form of a W/O emulsion.

Polymerizable compound (MN-1)

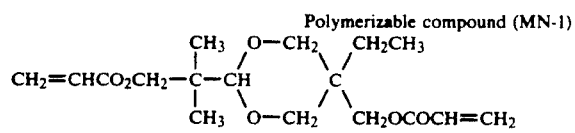

Trade name: Cayalad R604 (available from NIPPON KAYAKU Co., Ltd.)

Polymerizable compound (MN-2)

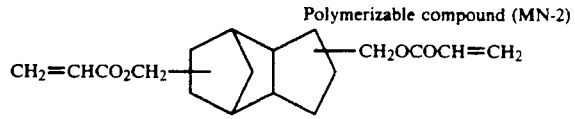

Trade name: Cayalad R684 (available from NIPPON KAYAKU Co., Ltd.)

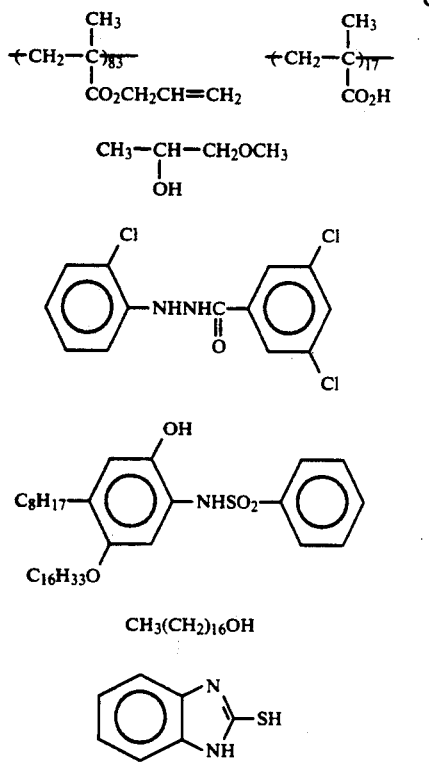

Copolymer (1P-1)

(SV-1)

(RD-1)

(RD-2)

(ST-1)

(FF-3)

Preparation of Microcapsule Dispersion (CB-1)

To 4.0 g of 15% aqueous solution of the following polymer (2P-1) was added 36 g of distilled water, and then the pH value was adjusted to 5.0 using 2N sulfuric acid. To the resulting mixture was added 60 g of 10% aqueous solution of the following polymer (2P-2) and the obtained mixture was stirred at 60° C. for 30 minutes. Then the above-mentioned light-sensitive composition (PB-1) was added to the mixture and the resulting mixture was stirred at 7,000 r.p.m. for 20 minutes at 60° C. using a dissolver of 40φ to obtain a W/O/W emulsion.

Independently, to 31.5 g of melamine were added 52.2 g of 37% aqueous solution of formaldehyde and 170.3 g of distilled water, and the resulting mixture was stirred at 60° C. for 30 minutes to obtain a transparent melamine-formaldehyde precondensate.

To 148 g of the above-prepared W/O/W emulsion was added 25 g of the above-prepared precondensate having been cooled to 25° C. While the resulting mixture was stirred at 1,200 r.p.m. using a propeller mixer, the pH value was adjusted to 5.0 using 2N sulfuric acid. The mixture was then gradually heated so that the temperature might be 70° C. after heating for 30 minutes, and then further stirred for 30 minutes. Further, to the mixture was added 10.3 g of 40% aqueous solution of urea, and the mixture was adjusted to pH 3.5 using 2N sulfuric acid, and then stirred at 70° C. for 40 minutes. Then the mixture was cooled to 25° C., and adjusted to pH 6.5 using 2N aqueous solution of sodium hydroxide. Thus, a light-sensitive microcapsule dispersion (CB-1) containing microcapsules having a melamine-formaldehyde resin shell was prepared.

Preparation of Microcapsule Dispersion (CG-1)

To 4.0 g of 15% aqueous solution of the following polymer (2P-1) was added 26 g of distilled water, and then the pH value was adjusted to 5.0 using 2N sulfuric acid. To the resulting mixture was added 70 g of 10% aqueous solution of the following polymer (2P-2) and the obtained mixture was stirred at 60° C. for 30 minutes. Then the above-mentioned light-sensitive composition (PG-1) was added to the mixture and the resulting mixture was stirred at 5,000 r.p.m. for 20 minutes at 60° C. by means of a dissolver of 40φ to obtain a W/O/W emulsion.

Then the procedure of the preparation of (CB 1) was repeated except for using 146 g of the above-prepared W/O/W emulsion to prepare a light-sensitive microcapsule dispersion (CG-1).

Preparation of Microcapsule Dispersion (CR-1)

To 4.0 g of 15% aqueous solution of the following polymer (2P-1) was added 36 g of distilled water, and then the pH value was adjusted to 5.0 using 2N sulfuric acid. To the resulting mixture was added 60 g of 10% aqueous solution of the following polymer (2P-2) and the obtained mixture was stirred at 60° C. for 30 minutes. Then the above-mentioned light-sensitive composition (PR-1) was added to the mixture and the resulting mixture was stirred at 5,000 r.p.m. for 20 minutes at 50° C. by means of a dissolver of 40φ to obtain a W/O/W emulsion.

Then the procedure of the preparation of (CB-1) was repeated except for using the above-prepared W/O/W emulsion to prepare a light-sensitive microcapsule dispersion (CR-1).

Polymer (2P-1)
Potassium polyvinylbenzenesulfinate
Polymer (2P-2)
Polyvinyl pyrrolidone K-90

Preparation of Light-Sensitive Material 101

To a mixture of 24 g of the light-sensitive microcapsule dispersion (CB-1), 36 g of the light-sensitive microcapsule dispersion (CG-1) and 57.6 g of the light-sensitive microcapsule dispersion (CR-1) were added 0.5 g of the following surface active agent (WW-1), 1.3 g of 10% aqueous solution of the following surface active agent (WW-2) and 25 g of 10% aqueous solution of carboxyl modified polyvinyl alcohol (tradename: PVA KL 318, available from Kuraray Co., Ltd.) at 40° C. to prepare a coating solution.

With 131 cc/m² of the prepared coating solution, a thin aluminum layer deposited on a polyethylene terephthalate film (thickness: 25 μm) was coated according to the extrusion method. Then the coated layer of the solution was dried at 60° C. The dried coated film was rolled up under the conditions of 25° C. and 65% so that the coated surface might be inside. Thus, a light-sensitive material (101) as a comparison example was prepared. The obtained light-sensitive material (101) was stored under the conditions of 25° C. and 55% in a sealed aluminum-laminated bag.

Surface active agent (WW-1)

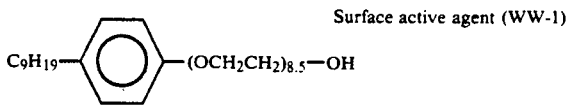

-continued

Surface active agent (WW-2)

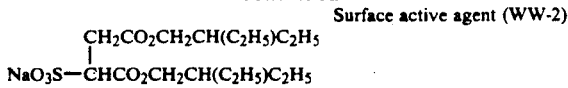

Preparation of Image-Receiving Material (RS-1)

A mixture of 240 g of calcium carbonate (tradename: PC700, available from Shiraishi Industrial Co., Ltd.), 5.6 g of the following surface active agent (poize 520, available from Kao Co., Ltd.) and 354.4 g of water was stirred at 8,000 r.p.m. for 3 minutes using a dispersing device (tradename: Ultra Disperser LK-41, Yamato Science Co., Ltd.). To 52 g of the resulting dispersion was added 52 g of 10% aqueous solution of polyvinyl alcohol (tradename: PVA-117, available from Kuraray Co., Ltd.), and then 4 ml of 1% aqueous solution of the following surface active agent and 22 ml of water were further added. Thus a coating solution for an image-receiving layer was prepared.

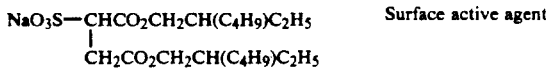

Surface active agent

The coating solution was uniformly applied onto a paper having a basis weight of 80 g/m² (i.e., a paper having a fiber length distribution [defined by JIS-P-8207] in which the sum of weight percent of 24 mesh residue and 42 mesh residue is within a range of 30–60%, as described in Japanese Patent Provisional Publication No. 63(1988)-186239) in an amount of 65 g/m², and the coated layer of the solution was dried at 60° C. to prepare an image-receiving material (RS-1).

Image Formation and Evaluation Thereof

The following experiments were carried out under the conditions of 25° C. and 50%. The light-sensitive material (101) taken out from the sealed bag was exposed to light at color temperature of 3,100K. using a halogen lamp through filters of: a step wedge in which the transmission density is changed from 0 to 4.0, ND filter in which the transmission density is 1.0 and CC filters of yellow and magenta (available from Fuji Photo Film Co., Ltd.) so that the gray balance might be adjusted.

The exposed light-sensitive material (101) was then heated from the side of the support at 150° C. for 2 seconds by means of a thermal developer having an exhaust device.

After 2 seconds, the light-sensitive material was superposed on the image-receiving material (RS-1) so that the coated layers of both materials might be in contact with each other, and they were passed through a pressure roller (diameter: 15 mm) heated at 70° C. at a pressure of 300 kg/cm² at the speed of 3 m/min for conveying the materials.

The light-sensitive material was then removed from the image-receiving material. Thus a clear positive image was formed on the image-receiving material.

The density of the image was measured using a densitometer (X-Rite 310). As the results, the maximum density was 1.25, and the minimum density was 0.08.

EXAMPLE 2

A light-sensitive material was prepared in the same manner as in Example 1, except that the thickness of the polyethylene terephthalate film support was changed from 25 μm to 12 μm. The prepared light-sensitive material was evaluated in the same manner as in Example 1.

As the results, a clear positive image was formed on the image-receiving material. The maximum density was 1.28, and the minimum density was 0.09.

COMPARISON EXAMPLE 1

An image was formed on the image receiving material in the same manner as in Example 1, except that the temperature of the heated rollers was changed from 70° C. to 25° C.

As the results, the maximum density was 0.90, and the minimum density was 0.10. The quality of the obtained image was inferior to that of Example 1.

COMPARISON EXAMPLE 2

An image was formed on the image receiving material in the same manner as in Example 1, except that the pressure of the heated rollers was changed from 300 kg/cm² to 15 kg/cm².

As the results, the maximum density was 0.82, and the minimum density was 0.07. The quality of the obtained image was inferior to that of Example 1. Further, low density spots were observed on the image.

COMPARISON EXAMPLE 3

An image was formed on the image receiving material in the same manner as in Example 1, except that the diameter of the heated rollers was changed from 15 mm to 60 mm.

As the results, a clear positive image was formed on the image-receiving material. The maximum density was 1.35, and the minimum density was 0.11. However, the weight of the rollers was 16 times as much as those used in Example 1. Further, a large device for moving the rollers was necessary.

COMPARISON EXAMPLE 4

An image was formed on the image receiving material in the same manner as in Example 1, except that the speed for conveying the materials was changed from 3 m/min to 40 m/min.

As the results, the maximum density was 0.97, and the minimum density was 0.08. The quality of the obtained image was inferior to that of Example 1. Further, low density spots were observed on the image.

I claim:

1. An image forming method which comprises the steps of:
   imagewise exposing a light-sensitive material which comprises a support and a light-sensitive layer provided thereon containing silver halide, a reducing agent, pigment particles, an ethylenically unsaturated polymerizable compound and a base precursor, said silver halide, said reducing agent, said pigment particles, said polymerizable compound and said base precursor being contained in microcapsules which are dispersed in the light-sensitive layer;
   simultaneously or thereafter developing the light-sensitive material to polymerize the polymerizable compound;
   pressing the light-sensitive material on an image receiving material to transfer the pigment particles to the image receiving material at a pressure in the range of 20 kg/cm² to 500 kg/cm² while heating the light-sensitive material at 30° C. to 130° C.;

wherein the light-sensitive material and the image receiving material are (1) pressed by rollers, and (2) conveyed at a speed of 0.3 m/min to 30.0 m/min between the rollers.

2. The image forming method as claimed in claim 1, wherein the light-sensitive material is pressed at a pressure in the range of 50 kg/cm² to 300 kg/cm².

3. The image forming method as claimed in claim 1, wherein the light-sensitive material is heated at 50° C. to 90° C.

4. The image forming method as claimed in claim 1, wherein at least one of the rollers facing the light-sensitive material is a heated roller, and the light-sensitive material is heated by the heated roller.

5. The image forming method as claimed in claim 1, wherein the rollers have a diameter of 5 mm to 40 mm.

6. The image forming method as claimed in claim 1, wherein the rollers have a diameter of 10 mm to 30 mm.

7. The image forming method as claimed in claim 1, wherein the light-sensitive material and the image receiving material are conveyed at a speed of 1 m/min to 5 m/min between the rollers.

8. The image forming method as claimed in claim 1, wherein the support of the light-sensitive material is made of a polymer film.

9. The image forming method as claimed in claim 1, wherein the support has a thickness of 5 μm to 50 μm.

10. The image forming method as claimed in claim 1, wherein the support ha a thickness of 6 μm to 30 μm.

11. The image forming method as claimed in claim 1, wherein the light-sensitive material is developed by a heat development process.

12. The image forming method as claimed in claim 11, wherein the heat development process is conducted at a temperature range of 60° C. to 250° C.

13. The image forming method as claimed in claim 11, wherein the heat development process is conducted at a temperature range of 80° C. to 180° C.

14. The image forming method as claimed in claim 11, wherein the heat development process occurs in 0.1 to 5 seconds.

15. The image forming method as claimed in claim 1, wherein the polymerizable compound is polymerized within an area where a latent image of silver halide has been formed by the imagewise exposure.

* * * * *

UNITED STATES PATENT AND TRADEMARK OFFICE
CERTIFICATE OF CORRECTION

PATENT NO. : 5,246,811

DATED : September 21, 1993

INVENTOR(S) : Manabu Higuchi

It is certified that error appears in the above-identified patent and that said Letters Patent is hereby corrected as shown below:

On title page, item [73] after "Kanagawa" insert --; Seiko Epson Corp.; Seiko Instruments, Inc., both of Tokyo, all of--.

Signed and Sealed this

Twenty-fourth Day of May, 1994

Attest:

BRUCE LEHMAN

Attesting Officer

Commissioner of Patents and Trademarks